(12) United States Patent
Shimazu et al.

(10) Patent No.: US 12,424,508 B2
(45) Date of Patent: Sep. 23, 2025

(54) POWER MODULE

(71) Applicant: Hitachi Astemo, Ltd., Hitachinaka (JP)

(72) Inventors: Hiromi Shimazu, Tokyo (JP); Yujiro Kaneko, Hitachinaka (JP); Yusuke Takagi, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 451 days.

(21) Appl. No.: 17/925,423

(22) PCT Filed: Jan. 22, 2021

(86) PCT No.: PCT/JP2021/002143
§ 371 (c)(1),
(2) Date: Nov. 15, 2022

(87) PCT Pub. No.: WO2021/235002
PCT Pub. Date: Nov. 25, 2021

(65) Prior Publication Data
US 2023/0187305 A1    Jun. 15, 2023

(30) Foreign Application Priority Data
May 18, 2020   (JP) .................................. 2020-086435

(51) Int. Cl.
*H01L 23/367*  (2006.01)
*H01L 23/00*   (2006.01)
*H01L 25/07*   (2006.01)

(52) U.S. Cl.
CPC .......... *H01L 23/3675* (2013.01); *H01L 24/32* (2013.01); *H01L 25/072* (2013.01);
(Continued)

(58) Field of Classification Search
CPC ... H01L 23/3675; H01L 24/32; H01L 25/072; H01L 2224/32245; H01L 2924/1011;
(Continued)

(56) References Cited

U.S. PATENT DOCUMENTS 6,762,491 B1    7/2004  Hatae et al.
9,357,643 B2 *  5/2016  Yano .................... H05K 1/0306
(Continued)

FOREIGN PATENT DOCUMENTS

JP    2002-076197 A    3/2002
JP    2004-228352 A    8/2004
(Continued)

OTHER PUBLICATIONS

Machine English translation of CN 103238269; Power Conversion Device; Higuchi et al.; published Jun. 24, 2015.*
(Continued)

*Primary Examiner* — Peniel M Gumedzoe
(74) *Attorney, Agent, or Firm* — Foley & Lardner LLP

(57) ABSTRACT

A power module includes a first conductor plate to which a first power semiconductor element is bonded, a second conductor plate to which a second power semiconductor element is bonded, the second conductor plate being disposed adjacent to the first conductor plate, a first heat-dissipating member disposed counter to the first conductor plate and the second conductor plate, and a first insulating sheet member disposed between the first heat-dissipating member and the first conductor plate. The first power semiconductor element is disposed at a position at which a first length from an end of the first conductor plate, the end being closer to the second conductor plate, to the first power semiconductor element is larger than a second length from an end of the first conductor plate, the end being far from the second conductor plate, to the first power semiconductor (Continued)

element, and the second length is larger than the thickness of the first conductor plate.

8 Claims, 6 Drawing Sheets

(52) U.S. Cl.
CPC ............... *H01L 2224/32245* (2013.01); *H01L 2924/1011* (2013.01); *H01L 2924/1611* (2013.01); *H01L 2924/16196* (2013.01); *H01L 2924/16251* (2013.01); *H01L 2924/1815* (2013.01); *H01L 2924/182* (2013.01); *H01L 2924/186* (2013.01)

(58) Field of Classification Search
CPC ... H01L 2924/1611; H01L 2924/16196; H01L 2924/16251; H01L 2924/1815; H01L 2924/182; H01L 2924/186
See application file for complete search history.

(56) References Cited

U.S. PATENT DOCUMENTS

| | | |
|---|---|---|
| 2018/0005986 A1 | 1/2018 | Yamashita et al. |
| 2018/0211938 A1 | 7/2018 | Tsuyuno et al. |
| 2019/0103402 A1* | 4/2019 | Tsuchimochi .......... H01L 24/49 |
| 2020/0303360 A1 | 9/2020 | Tokuyama et al. |

FOREIGN PATENT DOCUMENTS

| | | |
|---|---|---|
| JP | 2015-019003 A | 1/2015 |
| JP | 2016-059147 A | 4/2016 |
| JP | 2016-146398 A | 8/2016 |
| JP | 2017-183440 A | 10/2017 |
| JP | 2018-113343 A | 7/2018 |

OTHER PUBLICATIONS

International Search Report with English Translation and Written Opinion dated May 25, 2021 in corresponding International Application No. PCT/JP2021/002143.

* cited by examiner

POWER MODULE

TECHNICAL FIELD

The present invention relates to a power module.

BACKGROUND ART

A power module that performs power conversion through switching operations of a power semiconductor element offers high conversion efficiency, and is therefore widely used in consumer products, in-vehicle equipment, railway equipment, substation facilities, and the like. However, because the power semiconductor element repeatedly generates heat as a result of its switching operations, the power module is required to be highly reliable in operation. For example, the power module for use in in-vehicle equipment is required to be highly reliable as a reduction in its size and weight is in demand.

PTL 1 discloses a power module in which conductor plates are bonded to front and back surfaces of a power semiconductor element, respectively, heat-dissipating members are connected to the conductor plates via insulating layers, respectively, and heat generated from the power semiconductor element is transferred from the conductor plates to the heat-dissipating members via the insulating layers.

CITATION LIST

Patent Literature

PTL 1: JP 2018-113343 A

SUMMARY OF INVENTION

Technical Problem

Components in the power module repeatedly expand and contract due to repetitive cycles of heat generation by the power semiconductor element. As a result, the insulating layers (insulating sheet members) between the conductor plates and the heat-dissipating members peel off, which leads to a drop in the heat dissipation performance of the power module.

Solution to Problem

A power module according to the present invention includes: a first power semiconductor element and a second power semiconductor element; a first conductor plate to which the first power semiconductor element is bonded; a second conductor plate to which the second power semiconductor element is bonded, the second conductor plate being disposed adjacent to the first conductor plate; a first heat-dissipating member disposed counter to the first conductor plate and the second conductor plate; and a first insulating sheet member disposed between the first heat-dissipating member and the first conductor plate. In a cross-section passing through the center of the first power semiconductor element and the center of the second power semiconductor element and perpendicular to a bonding surface between the first conductor plate and the first power semiconductor element, the first power semiconductor element is disposed at a position at which a first length from an end of the first conductor plate, the end being closer to the second conductor plate, to the first power semiconductor element is larger than a second length from an end of the first conductor plate, the end being far from the second conductor plate, to the first power semiconductor element. The second length is larger than the thickness of the first conductor plate.

A power module according to the present invention includes: a first power semiconductor element and a second power semiconductor element; a first conductor plate to which the first power semiconductor element is bonded; a second conductor plate to which the second power semiconductor element is bonded, the second conductor plate being disposed adjacent to the first conductor plate; a first heat-dissipating member disposed counter to the first conductor plate and the second conductor plate; and a first insulating sheet member disposed between the first heat-dissipating member and the first conductor plate. In a cross-section passing through the center of the first power semiconductor element and the center of the second power semiconductor element and perpendicular to a bonding surface between the first conductor plate and the first power semiconductor element, the first power semiconductor element is disposed at a position at which the central position of the first power semiconductor element is closer to an end of the first conductor plate, the end being far from the second conductor plate, than to an end of the first conductor plate, the end being closer to the second conductor plate, and a length from the end of the first conductor plate, the end being far from the second conductor plate, to the first power semiconductor element is larger than the thickness of the first conductor plate, while the second power semiconductor element is disposed at a position at which the central position of the second power semiconductor element is closer to an end of the second conductor plate, the end being far from the first conductor plate, than to an end of the second conductor plate, the end being closer to the first conductor plate, and a length from the end of the second conductor plate, the end being far from the first conductor plate, to the second power semiconductor element is larger than the thickness of the second conductor plate.

Advantageous Effects of Invention

According to the present invention, peeling of the insulating sheet member is prevented to maintain the heat dissipation performance of the power module.

DESCRIPTION OF EMBODIMENTS

Figure 1:
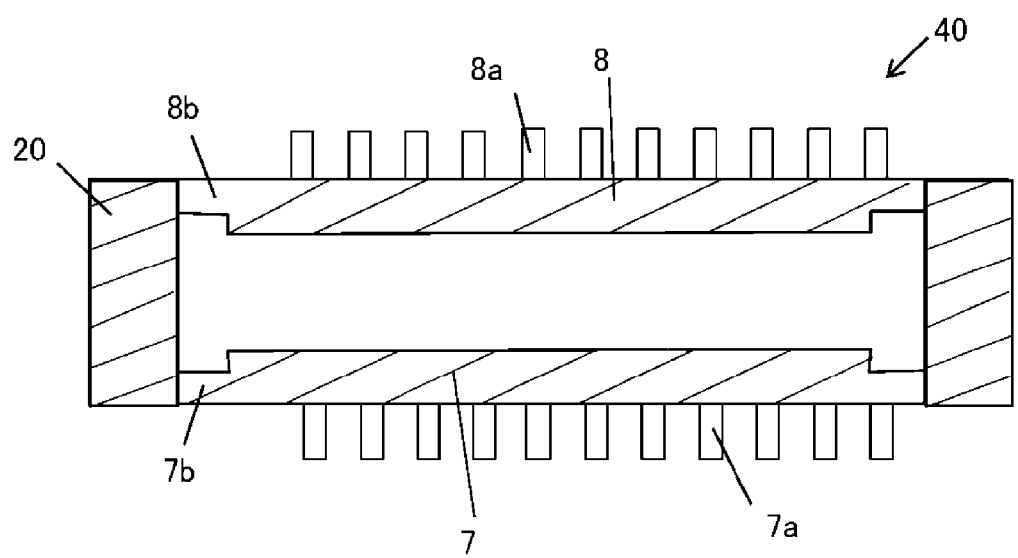
FIG. 1 is a cross-sectional view of a metal case according to a first embodiment.

Embodiments of the present invention will hereinafter be described with reference to the drawings. The following description and drawings are exemplary one for explanation of the present invention, and, when necessary, omissions and simplification are made in these description and drawings for clear explanations. The present invention can also be implemented in various forms other than embodiments described herein. Unless otherwise specified, each constituent element of a single form and of a plural form are both applicable.

Positions, sizes, shapes, ranges, and the like of constituent elements shown in the drawings may not represent actual positions, sizes, shapes, ranges, and the like. This is to facilitate understanding of the invention. The present invention, therefore, is not necessarily limited by positions, sizes, shapes, ranges, and the like indicated in the drawings.

First Embodiment

The present embodiment will hereinafter be described with reference to drawings.

FIG. 1 is a cross-sectional view of a metal case 40 in which a semiconductor module 30 is housed. A power module 100, which will be described later, is configured by housing the semiconductor module 30 in the metal case 40.

As shown in FIG. 1, the metal case 40 includes a first heat-dissipating member 7, a second heat-dissipating member 8, and a frame 20. The surface of the first heat-dissipating member 7 is provided with a plurality of heat-dissipating fins 7a. The surface of the second heat-dissipating member 8 is provided with a plurality of heat-dissipating fins 8a.

The first heat-dissipating member 7 and the second heat-dissipating member 8 have their respective peripheral ends 7b and 8b bonded to the frame 20. As a bonding method, for example, friction stir welding (FSW), laser welding, brazing, or the like can be adopted. By using the metal case 40 of the above shape, a refrigerant's entering the power module 100 can be prevented even if the power module 100 is disposed in a channel through which a refrigerant, such as water, oil, or organic substance, flows.

In the present embodiment, a case where the first heat-dissipating member 7, the second heat-dissipating member 8, and the frame 20 are separate members has been described. The first heat-dissipating member 7, the second heat-dissipating member 8, and the frame 20, however, may be the same members or integrated into a single member.

Figure 3:
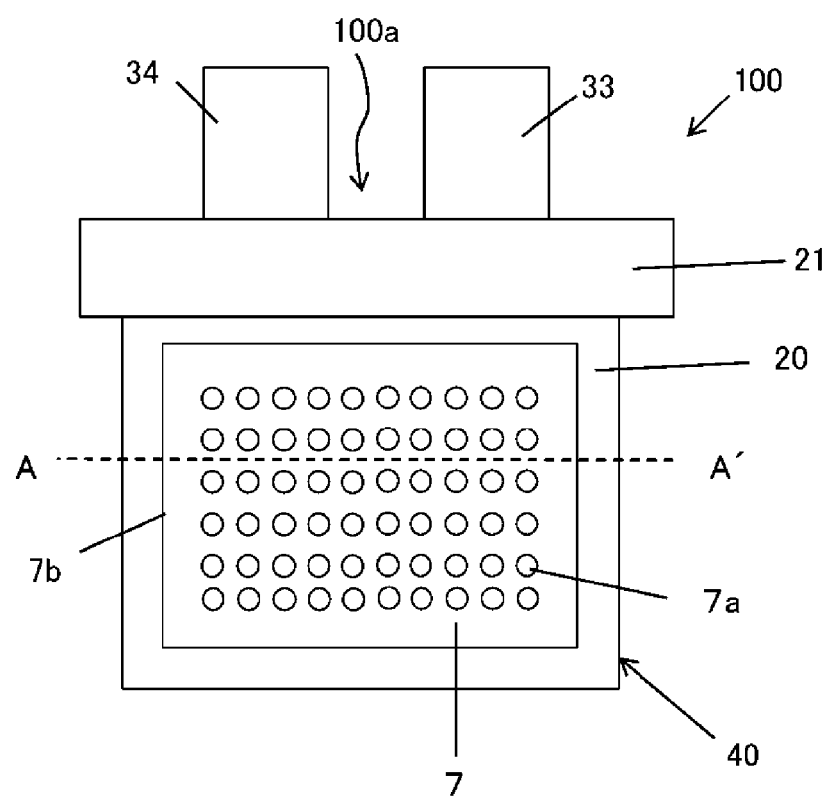
FIG. 3 is an external plan view of a power module according to the first embodiment.

The metal case 40, which will be described in detail later with reference to FIG. 3, is a cooler of a flat tubular shape having, for example, an insertion slot 100a on one surface and a bottom on the other surface. The metal case 40 is formed of a member having electrical conductivity, e.g., such a composite material as Cu, Cu alloy, Cu—C, and Cu—CuO, or such a composite material as Al, Al alloy, AlSiC, and Al—C.

Figure 2:
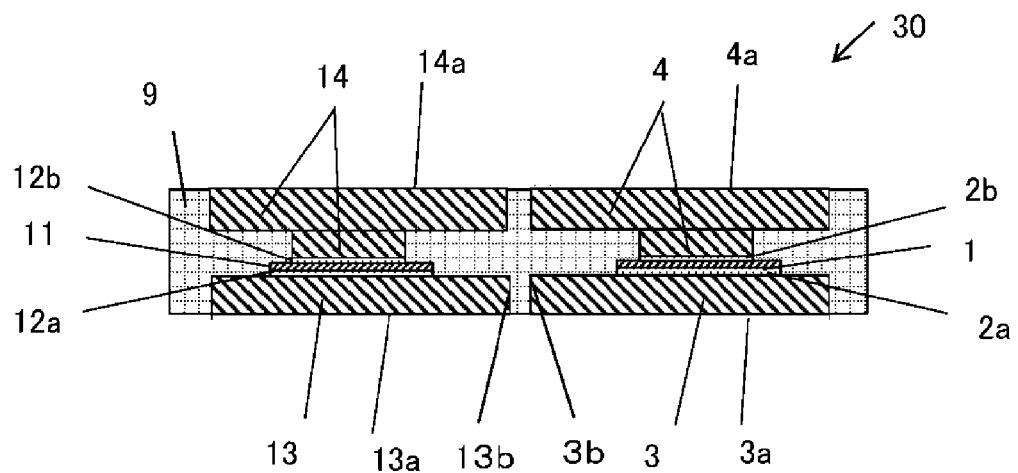
FIG. 2 is a cross-sectional view of a semiconductor module according to the first embodiment.

FIG. 2 is a cross-sectional view of the semiconductor module 30.

As shown in FIG. 2, a first conductor plate 3, to which a first power semiconductor element 1 is bonded, and a second conductor plate 13, to which a second power semiconductor element 11 is bonded, are disposed adjacent to each other. The first power semiconductor element 1 is bonded to the first conductor plate 3 by a bonding material 2a. The second power semiconductor element 11 is bonded to the second conductor plate 13 by a bonding material 12a.

A surface of first power semiconductor element 1 that is opposite to a surface of the same that is bonded to the first conductor plate 3 is bonded to a third conductor plate 4, using a bonding material 2b. The first power semiconductor element 1 carries electrodes on its both surfaces, and these electrode surfaces are counter respectively to the first conductor plate 3 and the third conductor plate 4, that is, the electrode surfaces are sandwiched between the first conductor plate 3 and the third conductor plate 4.

A surface of second power semiconductor element 11 that is opposite to a surface of the same that is bonded to the second conductor plate 13 is bonded to a fourth conductor plate 14, using a bonding material 12b. The second power semiconductor element 11 carries electrodes on its both electrode surfaces, which are counter respectively to the second conductor plate 13 and the fourth conductor plate 14, that is, the electrode surfaces are sandwiched between the second conductor plate 13 and the fourth conductor plate 14.

The semiconductor module 30 is configured such that the first power semiconductor element 1, the second power semiconductor element 11, the first conductor plate 3, the second conductor plate 13, the third conductor plate 4, and the fourth conductor plate 14 are sealed with a first sealing resin 9. Along the whole surface of the semiconductor module 30, the first sealing resin 9 leaves a surface 3a of the first conductor plate 3, a surface 13a of the second conductor plate 13, a surface 4a of the third conductor plate 4, and a surface 14a of the fourth conductor plate 14 exposed from the surface of the semiconductor module 30 but covers the other parts of these conductor plates entirely. One surface of the semiconductor module 30 is flush with the surface 3a of the first conductor plate 3 and with the surface 13a of the second conductor plate 13. Another surface of the semiconductor module 30 is flush with the surface 4a of the third conductor plate 4 and with the surface 14a of the fourth conductor plate 14.

The first conductor plate 3, the second conductor plate 13, the third conductor plate 4, and the fourth conductor plate 14 are formed of, for example, copper, copper alloy, aluminum, aluminum alloy, or the like. Although not shown in FIG. 2, the first conductor plate 3, the second conductor plate 13, the third conductor plate 4, and the fourth conductor plate 14 actually have wiring lines connected to leads according to a need or have leads formed as an integral part of the conductor plates.

FIG. 3 is an external plan view of the power module 100 according to the present embodiment. The power module 100 is configured such that the semiconductor module 30 shown in FIG. 2 is housed in the metal case 40 shown in FIG. 1.

The metal case 40 is of a flat tubular shape having a flange 21 on one side and a bottom on the other side. The insertion slot 100a is formed on the surface of the flange 21, and the semiconductor module 30 is inserted in the insertion slot 100a. Terminals 33 and 34, which are connected to the semiconductor module 30 inside, are led out of the insertion slot 100a. The first heat-dissipating member 7 has its peripheral end 7b bonded to the frame 20 of the metal case 40. The surface of the first heat-dissipating member 7 is provided with the plurality of heat-dissipating fins 7a, and a refrigerant (not illustrated) flows between the heat-dissipating fins 7a to cool the power module 100.

Figure 4:
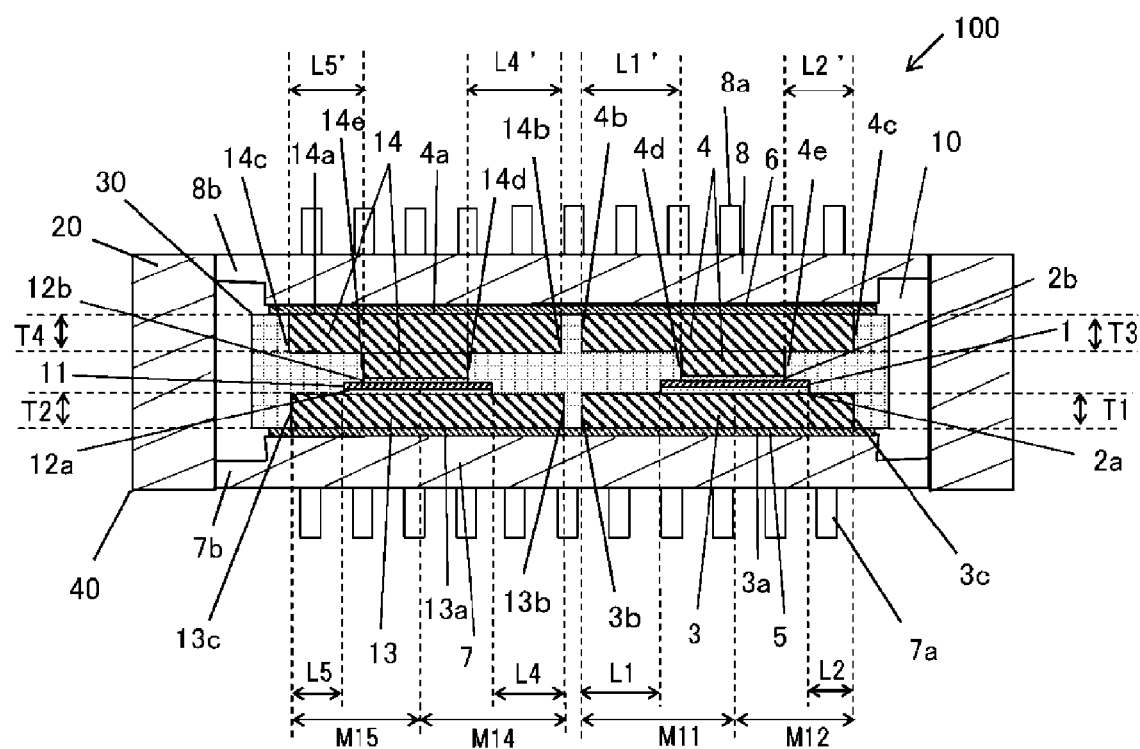
FIG. 4 is a cross-sectional view of the power module according to the first embodiment.

FIG. 4 is a cross-sectional view of the power module 100 shown in FIG. 3, the cross-sectional view being taken along a line A-A'. This cross-sectional view taken along the line A-A' is a cross-sectional view taken along a plane passing through the center of the first power semiconductor element 1 and the center of the second power semiconductor element 11.

As shown in FIG. 4, between both surfaces of the semiconductor module 30 and the first heat-dissipating member 7 and the second heat-dissipating member 8, a first insulating sheet member 5 and a second insulating sheet member 6, which are thermally conductive, are interposed respectively. The first insulating sheet member 5 and the second insulating sheet member 6 transfer heat generated by the semiconductor module 30, to the first heat-dissipating member 7 and the second heat-dissipating member 8, and are formed of a material having high thermal conductivity and a large withstand voltage. For example, the first insulating sheet member 5 and the second insulating sheet member 6 are provided as fine powder of aluminum oxide (alumina), aluminum nitride, or the like, insulating sheets containing carbon or the like, insulating layers, or adhesives.

As shown in FIG. 2, the surface 3a of the first conductor plate 3 and the surface 13a of the second conductor plate 13 are exposed on both surfaces of the semiconductor module 30, and are bonded to the first insulating sheet member 5, as shown in FIG. 4. A surface of first insulating sheet member 5 that is confronting to a surface of the same that is bonded to the first conductor plate 3 and the second conductor plate 13 is bonded to the first heat-dissipating member 7, so that heat can be transferred from the first conductor plate 3 and the second conductor plate 13 to the first heat-dissipating member 7.

As shown in FIG. 2, the surface 4a of the third conductor plate 4 and the surface 14a of the fourth conductor plate 14 are exposed on both surfaces of the semiconductor module 30, and are bonded to the second insulating sheet member 6, as shown in FIG. 4. A surface of second insulating sheet member 6 that is confronting to a surface of the same that is bonded to the third conductor plate 4 and the fourth conductor plate 14 is bonded to the second heat-dissipating member 8, so that heat can be transferred from the third conductor plate 4 and the fourth conductor plate 14 to the second heat-dissipating member 8.

In the power module 100, the metal case 40 is bonded to the semiconductor module 30 via the first insulating sheet member 5 and the second insulating sheet member 6, and a space not occupied by these components is filled with a second sealing resin 10. The power module 100 of a double-side cooling type will be described as an example. The power module 100, however, may be a single-side cooling type.

According to the power module 100 of the present embodiment, in a cross-section passing through the center of the first power semiconductor element 1 and the center of the second power semiconductor element 11 and perpendicular to a bonding surface between the first conductor plate 3 and the first power semiconductor element 1, that is, in a cross-section shown in FIG. 4, the first power semiconductor element 1 is disposed at a position at which a first length L1 from an end 3b of the first conductor plate 3, the end 3b being closer to the second conductor plate 13, to the first power semiconductor element 1 is larger than a second length L2 from an end 3c of the first conductor plate 3, the end 3c being far from the second conductor plate 13, to the first power semiconductor element 1. The second length L2 is larger than a thickness T1 of the first conductor plate 3. The first conductor plate 3 is of a plate shape, whose both ends are the end 3b and the end 3c. The first power semiconductor element 1 is too of a plate shape, and a distance from its one end to the end 3b of the first conductor plate 3 is equivalent to first length L1. A distance from the other end of the first power semiconductor element 1 to the end 3c of the first conductor plate 3 is equivalent to the second length L2.

In the cross-section passing through the center of the first power semiconductor element 1 and the center of the second power semiconductor element 11 and perpendicular to a bonding surface between the second conductor plate 13 and the second power semiconductor element 11, that is, in the cross-section shown in FIG. 4, the second power semiconductor element 11 is disposed at a position at which a fourth length L4 from an end 13b of the second conductor plate 13, the end 13b being closer to the first conductor plate 3, to the second power semiconductor element 11 is larger than a fifth length L5 from an end 13c of the second conductor plate 13, the end 13c being far from the first conductor plate 3, to the second power semiconductor element 11. The fifth length L5 is larger than a thickness T2 of the second conductor plate 13. The thickness T2 of the second conductor plate 13 may be equal to the thickness T1 of the first conductor plate 3 or may be different from the same. The second conductor plate 13 is of a plate shape, whose both ends are the end 13b and the end 13c. The second power semiconductor element 11 is too of a plate shape, and a distance from its one end to the end 13b of the second conductor plate 13 is equivalent to fourth length L4. A distance from the other end of the second power semiconductor element 11 to the end 13c of the second conductor plate 13 is equivalent to the fifth length L5.

The first power semiconductor element 1 and the second power semiconductor element 11 perform switching operations, that is, switch on and off repeatedly. When the first power semiconductor element 1 and the second power semiconductor element 11 generate heat, the heat is transferred to the first conductor plate 3 and to the second conductor plate 13, and is further transferred through the first insulating sheet member 5 to the first heat-dissipating member 7, which dissipates the heat to the outside.

When the first power semiconductor element 1 and the second power semiconductor element 11 generate heat as the first heat-dissipating member 7 is cooled by a refrigerant or the like, temperature inside the power module 100 rises to create a temperature distribution. In this temperature distribution, the temperatures of the first power semiconductor element 1 and second power semiconductor element 11, which are heating elements, are the highest, and the temperatures of the first conductor plate 3 and second conductor plate 13, the first insulating sheet member 5, and the first heat-dissipating member 7 get lower in descending order. A rise in the temperatures of the first power semiconductor element 1 and the second power semiconductor element 11 gives rise to elongation/deformation of each component. An amount of deformation of the first conductor plate 3 and second conductor plate 13 is different from that of the first heat-dissipating member 7, and this difference in the amount of deformation creates a thermal stress to the first insulating sheet member 5, which causes the first insulating sheet member 5 to peel off. This is a cause of a drop in the heat dissipation performance of the power module 100. When the density of the power module 100 is increased in future in response to a demand for reducing the size and weight of the power module 100, in particular, it increases the amount of heat generated by the power semiconductor elements, thus increasing the temperature inside the power module 100.

Now it is assumed that the first power semiconductor element 1 is disposed at the central position of the first conductor plate 3 at which L1=L2 holds while the second power semiconductor element 11 is disposed at the central position of the second conductor plate 13 at which L4=L5 holds. In this case, when the first power semiconductor element 1 generates heat, the temperature of the end 3b of the first conductor plate 3, the end 3b being closer to the second conductor plate 13, is equal to the temperature of the end 3c of the first conductor plate 3, the end 3c being far from the second conductor plate 13. Because the first conductor plate 3 and the second conductor plate 13 are disposed adjacent to each other, the temperature of the end 3b of the first conductor plate 3, the end 3b being closer to the second conductor plate 13, is under the influence of not only the heat from the first power semiconductor element 1 but also heat from the second power semiconductor element 11. For this reason, the temperature of the end 3b of the first conductor plate 3, the end 3b being closer to the second conductor plate 13, becomes higher than the temperature of the end 3c of the first conductor plate 3, the end 3c being far from the second conductor plate 13. Meanwhile, increasing the lengths L1, L2, L4, and L5 is not allowed because reducing the size and weight of the power module 100 is required. The thermal stress created at the first insulating sheet member 5, therefore, gets larger as the temperature of the first conductor plate 3, to which the first insulating sheet member 5 is bonded, gets higher.

Consequently, the thermal stress applied to the first insulating sheet member 5 at the end 3b of the first conductor plate 3, the end 3b being closer to the second conductor plate 13, becomes higher than the thermal stress applied to the first insulating sheet member 5 at the end 3c of the first conductor plate 3, in which case the first insulating sheet member 5 tends to peel off.

In the present embodiment, however, the first power semiconductor element 1 is disposed at the position at which L1>L2 holds, in which case, even if a temperature rise resulting from heat generation by the second power semiconductor element 11 is added to a temperature rise resulting from heat generation by the first power semiconductor element 1, the temperature of the end 3b of the first conductor plate 3 does not rise above the temperature of the end 3c of the first conductor plate 3, the end 3c being far from the second conductor plate 13. This suppresses an increase in the thermal stress applied to the first insulating sheet member 5 in the vicinity of the end 3b of the first conductor plate 3, the end 3b being closer to the second conductor plate 13. During power cycles in which the first power semiconductor element 1 repeatedly generates heat, therefore, the thermal stress repeatedly created at the first insulating sheet member 5 in the vicinity of the end 3b of the first conductor plate 3, the end 3b being closer to the second conductor plate 13, can be reduced, which improves the service life of the module exposed to the power cycles.

Likewise, in the present embodiment, the second power semiconductor element 11 is disposed at the position at which L4>L5 holds, in which case, even if a temperature rise resulting from heat generation by the first power semiconductor element 1 is added to a temperature rise resulting from heat generation by the second power semiconductor element 11, the temperature of the end 13b of the second conductor plate 13 does not rise above the temperature of the end 13c of the second conductor plate 13, the end 13c being far from the first conductor plate 3. This suppresses an increase in the thermal stress applied to the first insulating sheet member 5 in the vicinity of the end 13b of the second conductor plate 13, the end 13b being closer to the first conductor plate 3. During power cycles in which the first power semiconductor element 1 repeatedly generates heat, therefore, the thermal stress repeatedly created at the first insulating sheet member 5 in the vicinity of the end 13b of the second conductor plate 13, the end 13b being closer to the first conductor plate 3, can be reduced, which improves the service life of the module exposed to the power cycles.

In the present embodiment, an example of arrangement of the first power semiconductor element 1 and the first conductor plate 3 and of the second power semiconductor element 11 and the second conductor plate 13 has been described. The first power semiconductor element 1 and the third conductor plate 4 and the second power semiconductor element 11 and the fourth conductor plate 14 may also be put in specific arrangement as described below.

As shown in FIG. 4, in the cross-section passing through the center of the first power semiconductor element 1 and the center of the second power semiconductor element 11 and perpendicular to the bonding surface between the first conductor plate 3 and the first power semiconductor element 1, the first power semiconductor element 1 is disposed at a position at which a first length L1' from an end 4b of the third conductor plate 4, the end 4b being closer to the fourth conductor plate 14, to an end 4d of a portion of third conductor plate 4 that is bonded to the first power semiconductor element 1, the end 4d being closer to the fourth conductor plate 14, is larger than a second length L2' from an end 4c of the third conductor plate 4, the end 4c being far from the fourth conductor plate 14, to an end 4e of the portion of third conductor plate 4 that is bonded to the first power semiconductor element 1, the end 4e being far from the fourth conductor plate 14. The second length L2' is larger than a thickness T3 of the third conductor plate 4.

In the cross-section passing through the center of the first power semiconductor element 1 and the center of the second power semiconductor element 11 and perpendicular to the bonding surface between the second conductor plate 13 and the second power semiconductor element 11, the second power semiconductor element 11 is disposed at a position at which a fourth length L4' from an end 14b of the fourth conductor plate 14, the end 14b being closer to the third conductor plate 4, to an end 14d of a portion of fourth conductor plate 14 that is bonded to the second power semiconductor element 11, the end 14d being closer to the third conductor plate 4, is larger than a fifth length L5' from an end 14c of the fourth conductor plate 14, the end 14c being far from the third conductor plate 4, to an end 14e of the portion of fourth conductor plate 14 that is bonded to the second power semiconductor element 11, the end 14e being far from the third conductor plate 4. The fifth length L5' is larger than a thickness T4 of the fourth conductor plate 14.

In the present embodiment, the example in which the first power semiconductor element 1 is disposed at the position at which L1>L2 holds and the second power semiconductor element 11 is disposed at the position at where L4>L5 holds has been described. The first power semiconductor element 1 and the second power semiconductor element 11, however, may be disposed at positions that are determined with respect to their central positions, as described below.

In the cross-section passing through the center of the first power semiconductor element 1 and the center of the second power semiconductor element 11 and perpendicular to the bonding surface between the first conductor plate 3 and the first power semiconductor element 1, the first power semiconductor element 1 is disposed at a position at which the central position of the first power semiconductor element 1 is closer to the end 3c of the first conductor plate 3, the end 3c being far from the second conductor plate 13, than to the end 3b of the first conductor plate 3, the end 3b being closer to the second conductor plate 13. Specifically, as shown in FIG. 4, a length M11 from the central position of the first power semiconductor element 1 to the end 3b of the first conductor plate 3 is larger than a length M12 from the central position of the first power semiconductor element 1 to the end 3c of the first conductor plate 3. The length L2 from the end 3c of the first conductor plate 3, the end 3c being far from the second conductor plate 13, to the first power semiconductor element 1 is larger than the thickness T1 of the first conductor plate.

In addition, the second power semiconductor element 11 is disposed at a position at which the central position of the second power semiconductor element 11 is closer to the end 13c of the second conductor plate 13, the end 13c being far from the first conductor plate 3, than to the end 13b of the second conductor plate 13, the end 13b being closer to the first conductor plate 3. Specifically, as shown in FIG. 4, a length M14 from the central position of the second power semiconductor element 11 to the end 13b of the second conductor plate 13 is larger than a length M15 from the central position of the second power semiconductor element 11 to the end 13c of the second conductor plate 13. The length L5 from the end 13c of the second conductor plate 13, the end 13c being far from the first conductor plate 3, to the second power semiconductor element 11 is larger than the thickness T2 of the second conductor plate 13.

According to the present embodiment, peeling of the first insulating sheet member 5 and the second insulating sheet member 6 can be prevented to maintain the heat dissipation performance of the power module 100. The power module 100 with high reliability, therefore, can be provided.

Second Embodiment

Figure 5:
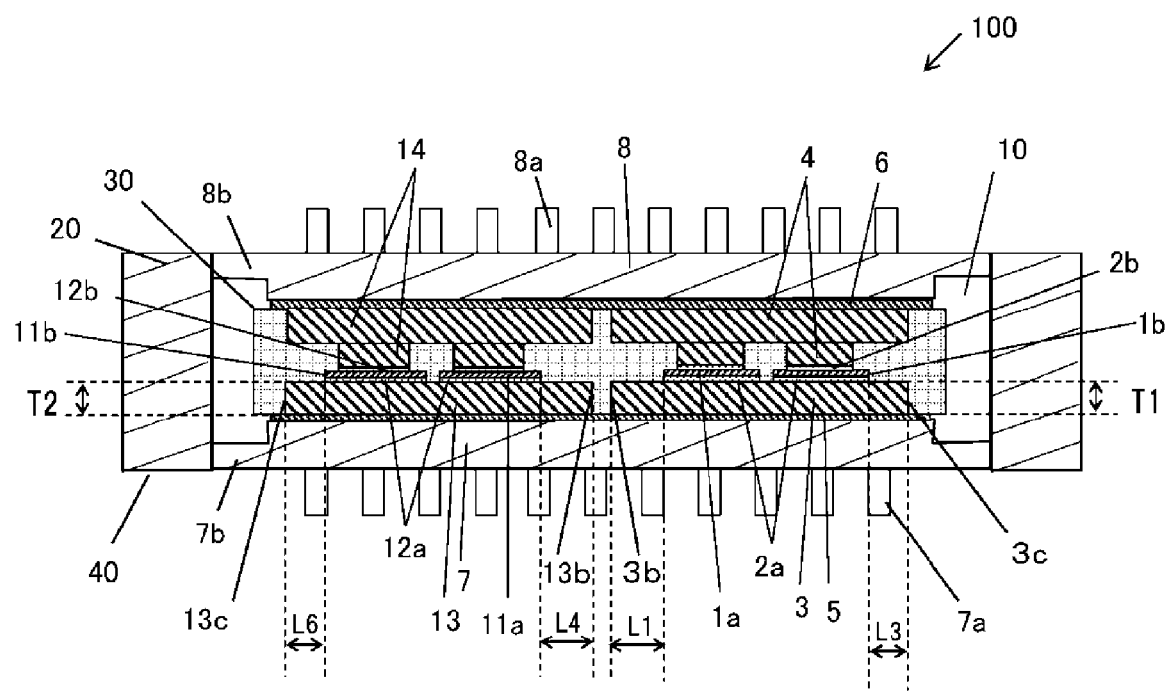
FIG. 5 is a cross-sectional view of a power module according to a second embodiment.

FIG. 5 is a cross-sectional view of a power module 100 according to a second embodiment. The cross-sectional view of the metal case 40 shown in FIG. 1 and the external plan view of the power module 100 shown in FIG. 3 are the same in the present embodiment.

The first embodiment has been described as an example of the power module 100 in which the first power semiconductor element 1 and the second power semiconductor element 2 are bonded to the first conductor plate 3 and the second conductor plate 13 adjacent to each other, using the bonding materials 2a and 12a, respectively. In the present embodiment, an example of the power module 100 of a double-side cooling type will be described, in which power module 100, as shown in FIG. 5, a plurality of power semiconductor elements is disposed on each of the conductor plate 3 and the conductor plate 13 adjacent to each other.

The first conductor plate 3 and the second conductor plate 13 are disposed adjacent to each other. To the first conductor plate 3, a first power semiconductor element 1a and a third power semiconductor element 1b are bonded, using the bonding material 2a. To the second conductor plate 13, a second power semiconductor element 11a and a fourth power semiconductor element 11b are bonded, using the bonding material 12a.

Surfaces of the first power semiconductor element 1a and the third power semiconductor element 1b, the surfaces being opposite to surfaces of the same that are bonded to the first conductor plate 3, are bonded to the third conductor plate 4, using the bonding material 2b. The first power semiconductor element 1a and the third power semiconductor element 1b carry electrodes on their both surfaces, and these electrode surfaces are counter respectively to the first conductor plate 3 and the third conductor plate 4, that is, the electrode surfaces are sandwiched between the first conductor plate 3 and the third conductor plate 4.

According to the power module 100 of the present embodiment, in a cross-section passing through the center of the first power semiconductor element 1a and the center of the second power semiconductor element 11a and perpendicular to a bonding surface between the first conductor plate 3 and the first power semiconductor element 1a, that is, in a cross-section shown in FIG. 5, the first power semiconductor element 1a and the third power semiconductor element 1b are disposed at a position at which a first length L1 from the end 3b of the first conductor plate 3, the end 3b being closer to the second conductor plate 13, to the first power semiconductor element 1a is larger than a third length L3 from the end 3c of the first conductor plate 3, the end 3c being far from the second conductor plate 13, to the third power semiconductor element 1b. The third length L3 is larger than the thickness T1 of the first conductor plate 3.

The second power semiconductor element 11a and the fourth power semiconductor element 11b are disposed at a position at which a fourth length L4 from the end 13b of the second conductor plate 13, the end 13b being closer to the first conductor plate 3, to the second power semiconductor element 11a is larger than a sixth length L6 from the end 13c of the second conductor plate 13, the end 13c being far from the first conductor plate 3, to the fourth power semiconductor element 11b. The sixth length L6 is larger than the thickness T2 of the second conductor plate 13. The thickness T2 of the second conductor plate 13 may be equal to the thickness T1 of the first conductor plate 3 or may be different from the same.

Except the above-described respects, configurations are identical with the configurations in the first embodiment that has been described with reference to FIG. 4. In the second embodiment, the power module 100 in which two power semiconductor elements are bonded to each of the conductor plates 3 and 13 adjacent to each other, using the bonding materials 2a and 12a, has been described exemplary. However, three or more power semiconductor elements may be bonded to each of the conductor plates 3 and 13 adjacent to each other. In this case, as in the above-described cases, attention is paid to the power semiconductor elements located closer to both ends of the conductor plate 3 and the same located closer to both ends of the conductor plate 13, and these power semiconductor elements are disposed at positions at which L1>L3 and L4>L6 hold.

According to the present embodiment, even when a plurality of power semiconductor elements is disposed on each conductor plate, peeling of the first insulating sheet member 5 and the second insulating sheet member 6 can be prevented to maintain the heat dissipation performance of the power module 100. The power module 100 with high reliability, therefore, can be provided.

Third Embodiment

Figure 6:
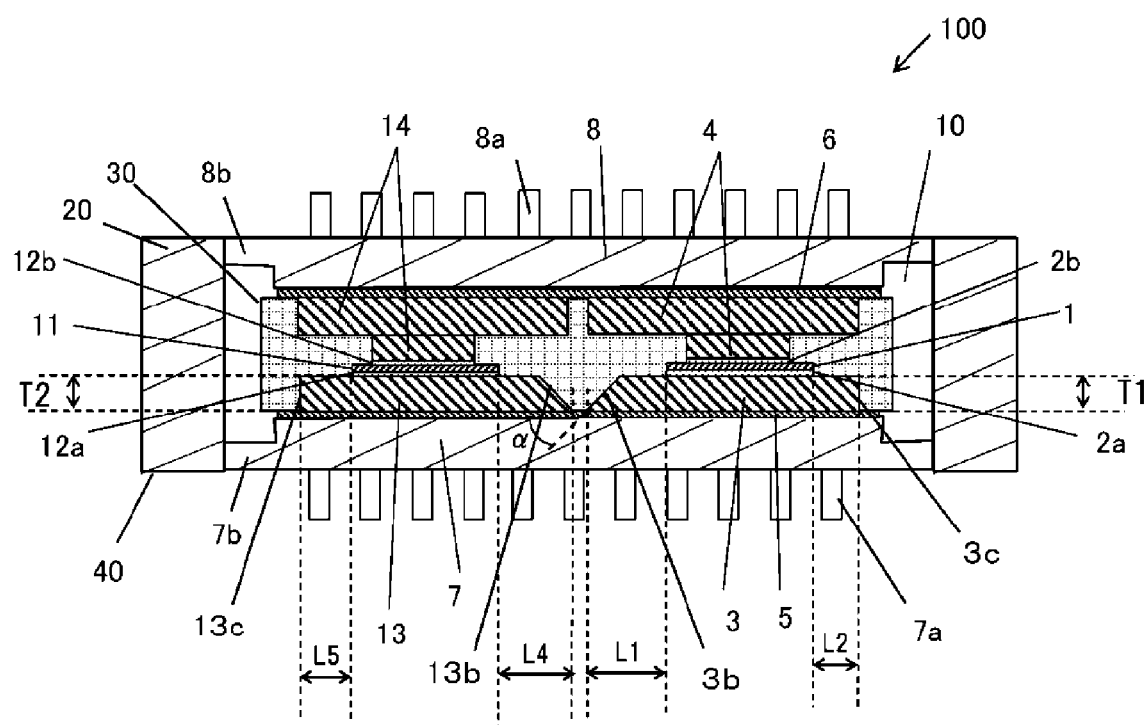
FIG. 6 is a cross-sectional view of a power module according to a third embodiment.

FIG. 6 is a cross-sectional view of a power module 100 according to a third embodiment. The cross-sectional view of the metal case 40 shown in FIG. 1 and the external plan view of the power module 100 shown in FIG. 3 are the same in the present embodiment.

According to the present embodiment, as shown in FIG. 6, in the cross-section passing through the center of the first power semiconductor element 1 and the center of the second power semiconductor element 11 and perpendicular to the bonding surface between the first conductor plate 3 and the first power semiconductor element 1, the end 3b of the first conductor plate 3, the end 3b being closer to the second conductor plate 13, and the end 13b of the second conductor plate 13, the end 13b being closer to the first conductor plate 3, are made into tapered shapes tapering toward a bonding point between the conductor plates 3 and 13 and the first insulating sheet member 5. In other words, at a connection part between the first conductor plate 3 and the first insulating sheet member 5 and a connection part between the second conductor plate 13 and the first insulating sheet member 5, a bonding angle α that a slope of the end 3b of the first conductor plate 3 and the surface of the first insulating sheet member 5 make is an acute angle. Likewise, a bonding angle α that a slope of the end 13b of the second conductor plate 13 and the surface of the first insulating sheet member 5 make is an acute angle. The bonding angle α is, for example, about 45° or less.

By determining the bonding angle α between the first conductor plate 3 and the first insulating sheet member 5 and between the second conductor plate 13 and the same, to be an acute angle, specificity resulting from bonding of different substances is reduced, which offers an effect of further reducing heat applied to the ends 3b and 13b. This suppresses an increase in a thermal stress at the part of first insulating sheet member 5 that is in contact with the ends 3b and 13b. During power cycles in which the first power semiconductor element 1 repeatedly generates heat, therefore, the thermal stress repeatedly developing at the part of first insulating sheet member 5 that is near the ends 3b and 13b can be reduced, which improves the service life of the power module 100 exposed to the power cycles.

In the present embodiment, the example in which the end 3b of the first conductor plate 3 and the end 13b of the second conductor plate 13 are each made into the tapered shape with the bonding angle α has been described. However, the end 3c of the first conductor plate 3 and the end 13c of the second conductor plate 13 may be each made into a tapered shape with a bonding angle β. It is preferable in this case that the bonding angle α be acuter than the bonding angle β. This configuration further reduces the thermal stress at the part of first insulating sheet member 5 that is closer to the end 3b of the first conductor plate 3 and the end 13b of the second conductor plate 13.

In the present embodiment, the example in which the end 3b of the first conductor plate 3 and the end 13b of the second conductor plate 13 are each made into the tapered shape with the bonding angle α has been described. However, ends of the third conductor plate 4 and the fourth conductor plate 14 may each be made into a tapered shape. For example, when ends of the third conductor plate 4 and the fourth conductor plate 14, the ends being adjacent to each other, are each made into a tapered shape, it reduces a thermal stress to the second insulating sheet member 6, in which case a space between the third conductor plate 4 and the fourth conductor plate 14 can be widened. In this case, the third conductor plate 4 and the fourth conductor plate 14 can be made out of less material, which allows cost reduction.

According to the present embodiment, the thermal stress to the first insulating sheet member 5 and the second insulating sheet member 6 is further reduced, which can prevent peeling of the first insulating sheet member 5 and the second insulating sheet member 6 to maintain the heat dissipation performance of the power module 100. The power module 100 with high reliability, therefore, can be provided.

In each of the above-described embodiments, the heat-dissipating fins 7a and 8a of the first and second heat-dissipating members 7 and 8 are formed as pin fins. These fins, however, may be formed as pins of different shapes, such as straight fins or corrugated fins.

The embodiments described above offers the following effects.

(1) The power module 100 includes: the first power semiconductor element 1 and the second power semiconductor element 11; the first conductor plate 3 to which the first power semiconductor element 1 is bonded; the second conductor plate 13 to which the second power semiconductor element 11 is bonded, the second conductor plate 13 being disposed adjacent to the first conductor plate 3; the first heat-dissipating member 7 disposed counter to the first conductor plate 3 and the second conductor plate 13; and the first insulating sheet member 5 disposed between the first heat-dissipating member 7 and the first conductor plate 3. In the cross-section passing through the center of the first power semiconductor element 1 and the center of the second power semiconductor element 11 and perpendicular to the bonding surface between the first conductor plate 3 and the first power semiconductor element 1, the first power semiconductor element 1 is disposed at the position at which the first length L1 from the end 3b of the first conductor plate 3, the end 3b being closer to the second conductor plate 13, to the first power semiconductor element 1 is larger than the second length L2 from the end 3c of the first conductor plate 3, the end 3c being far from the second conductor plate 13, to the first power semiconductor element 1. The second length L2 is larger than the thickness T1 of the first conductor plate 3. This configuration prevents peeling of the first insulating sheet member 5, thus maintaining the heat dissipation performance of the power module 100.

(2) The power module 100 includes: the first power semiconductor element 1 and the second power semiconductor element 11; the first conductor plate 3 to which the first power semiconductor element 1 is bonded; the second conductor plate 13 to which the second power semiconductor element 11 is bonded, the second conductor plate 13 being disposed adjacent to the first conductor plate 3; the first heat-dissipating member 7 disposed counter to the first conductor plate 3 and the second conductor plate 13; and the first insulating sheet member 5 disposed between the first heat-dissipating member 7 and the first conductor plate 3. In the cross-section passing through the center of the first power semiconductor element 1 and the center of the second power semiconductor element 11 and perpendicular to the bonding surface between the first conductor plate 3 and the first power semiconductor element 1, the first power semiconductor element 1 is disposed at the position at which the central position of the first power semiconductor element 1 is closer to the end 3c of the first conductor plate 3, the end 3c being far from the second conductor plate 13, than to the end 3b of the first conductor plate 3, the end 3b being closer to the second conductor plate 13 (M11>M12), and the length L1 from the end 3c of the first conductor plate, the end 3c being far from the second conductor plate 13, to the first power semiconductor element 1 is larger than the thickness T1 of the first conductor plate 3, while the second power semiconductor element 11 is disposed at the position at which the central position of the second power semiconductor element 11 is closer to the end 13c of the second conductor plate 13, the end 13c being far from the first conductor plate 3, than to the end 13b of the second conductor plate 13, the end 13b being closer to the first conductor plate 3 (M14>M15), and the length L5 from the end 13c of the second conductor plate, the end 13c being far from the first conductor plate 3, to the second power semiconductor element 11 is larger than the thickness T2 of the second conductor plate 13. This configuration prevents peeling of the first insulating sheet member 5, thus maintaining the heat dissipation performance of the power module 100.

The present invention is not limited to the above embodiments. Other embodiments that can be conceived within a range of the technical concept of the present invention are also included in the scope of the invention, providing that such embodiments do not impair features of the present invention. The above embodiments may be combined to provide a different embodiment.

REFERENCE SIGNS LIST 1 first power semiconductor element
2a, 2b, 12a, 12b bonding material
3 first conductor plate
3b, 3c end of the first conductor plate
4 third conductor plate
4b, 4d end of the third conductor plate 4
5 first insulating sheet member
6 second insulating sheet member
7 first heat-dissipating member
7a, 8a heat-dissipating fin
7b, 8b peripheral end
8 second heat-dissipating member
9 first sealing resin
10 second sealing resin
11 second power semiconductor element
13 second conductor plate
13b, 13c end of the second conductor plate
14 fourth conductor plate
14c, 14d end of the fourth conductor plate
20 frame
30 semiconductor module
40 metal case
100 power module
100a insertion slot
L1 first length
L2 second length
L3 third length
L4 fourth length
L5 fifth length
L6 sixth length
T1 thickness of the first conductor plate
T2 thickness of the second conductor plate

The invention claimed is:

1. A power module comprising:
a first power semiconductor element and a second power semiconductor element;
a first conductor plate to which the first power semiconductor element is bonded;
a second conductor plate to which the second power semiconductor element is bonded, the second conductor plate being disposed adjacent to the first conductor plate;
a first heat-dissipating member disposed counter to the first conductor plate and the second conductor plate; and
a first insulating sheet member disposed between the first heat-dissipating member and the first conductor plate, wherein in a cross-section passing through a center of the first power semiconductor element and a center of the second power semiconductor element and perpendicular to a bonding surface between the first conductor plate and the first power semiconductor element, the first power semiconductor element is disposed at a position at which a first length from an end of the first conductor plate, the end being closer to the second conductor plate, to the first power semiconductor element is larger than a second length from an end of the first conductor plate, the end being far from the second conductor plate, to the first power semiconductor element, and the second length is larger than a thickness of the first conductor plate, and wherein:
at least two power semiconductor elements of the first power semiconductor element and a third power semiconductor element are bonded to the first conductor plate, and the third power semiconductor element is bonded to a side of the first conductor plate, the side being farther from the second conductor plate than the first power semiconductor element is,
at least two power semiconductor elements of the second power semiconductor element and a fourth power semiconductor element are bonded to the second conductor plate, and the fourth power semiconductor element is bonded to a side of the second conductor plate, the side being farther from the first conductor plate than the second power semiconductor element is, and
in a cross-section passing through the center of the first power semiconductor element and the center of the second power semiconductor element and perpendicular to the bonding surface between the first conductor plate and the first power semiconductor element, the first power semiconductor element and the third power semiconductor element are disposed at a position at which the first length is larger than a third length from the end of the first conductor plate, the end being far from the second conductor plate, to the third power semiconductor element, and the third length is larger than the thickness of the first conductor plate.

2. The power module according to claim 1, wherein in a cross-section passing through the center of the first power semiconductor element and the center of the second power semiconductor element and perpendicular to a bonding surface between the second conductor plate and the second power semiconductor element, the second power semiconductor element is disposed at a position at which a fourth length from an end of the second conductor plate, the end being closer to the first conductor plate, to the second power semiconductor element is larger than a fifth length from an end of the second conductor plate, the end being far from the first conductor plate, to the second power semiconductor element, and the fifth length is larger than a thickness of the second conductor plate.

3. The power module according to claim 1, wherein in a cross-section passing through the center of the first power semiconductor element and the center of the second power semiconductor element and perpendicular to a bonding surface between the second conductor plate and the second power semiconductor element, the second power semiconductor element and the fourth power semiconductor element are disposed at a position at which a fourth length from an end of the second conductor plate, the end being closer to the first conductor plate, to the second power semiconductor element is larger than a sixth length from an end of the second conductor plate, the end being far from the first conductor plate, to the fourth power semiconductor element, and the sixth length is larger than a thickness of the second conductor plate.

4. The power module according to claim 1, wherein in a cross-section passing through the center of the first power semiconductor element and the center of the second power semiconductor element and perpendicular to the bonding surface between the first conductor plate and the first power semiconductor element, the end of the first conductor plate, the end being closer to the second conductor plate, is made into a tapered shape tapering toward a bonding point between the first conductor plate and the first insulating sheet member.

5. The power module according to claim 2, wherein in a cross-section passing through the center of the first power semiconductor element and the center of the second power semiconductor element and perpendicular to a bonding surface between the second conductor plate and the second power semiconductor element, the end of the second conductor plate, the end being closer to the first conductor plate, is made into a tapered shape tapering toward a bonding point between the second conductor plate and the first insulating sheet member.

6. The power module according to claim 1, comprising:
a third conductor plate bonded to a surface of the first power semiconductor element that is opposite to a surface of the first power semiconductor element that is bonded to the first conductor plate;
a fourth conductor plate bonded to a surface of the second power semiconductor element that is opposite to a surface of the second power semiconductor element that is bonded to the second conductor plate;
a second heat-dissipating member disposed counter to the third conductor plate and the fourth conductor plate; and
a second insulating sheet member disposed between the second heat-dissipating member and the third conductor plate.

7. The power module according to claim 6, comprising a case that is bonded to the first heat-dissipating member and the second heat-dissipating member disposed counter to each other, the case being bonded at peripheral parts of the first heat-dissipating member and the second heat-dissipating member, and that houses at least the first power semiconductor element, the second power semiconductor element, the first conductor plate, the second conductor plate, the first heat-dissipating member, and the first insulating sheet member.

8. A power module comprising:
a first power semiconductor element and a second power semiconductor element;
a first conductor plate to which the first power semiconductor element is bonded;
a second conductor plate to which the second power semiconductor element is bonded, the second conductor plate being disposed adjacent to the first conductor plate;
a first heat-dissipating member disposed counter to the first conductor plate and the second conductor plate; and
a first insulating sheet member disposed between the first heat-dissipating member and the first conductor plate, wherein
in a cross-section passing through a center of the first power semiconductor element and a center of the second power semiconductor element and perpendicular to a bonding surface between the first conductor plate and the first power semiconductor element,
the first power semiconductor element is disposed at a position at which the center of the first power semiconductor element is closer to an end of the first conductor plate, the end being far from the second conductor plate, than to an end of the first conductor plate, the end being closer to the second conductor plate, and a length from the end of the first conductor plate, the end being far from the second conductor plate, to the first power semiconductor element is larger than a thickness of the first conductor plate, and
the second power semiconductor element is disposed at a position at which the center of the second power semiconductor element is closer to an end of the second conductor plate, the end being far from the first conductor plate, than to an end of the second conductor plate, the end being closer to the first conductor plate, and a length from the end of the second conductor plate, the end being far from the first conductor plate, to the second power semiconductor element is larger than a thickness of the second conductor plate
wherein:
at least two power semiconductor elements of the first power semiconductor element and a third power semiconductor element are bonded to the first conductor plate, and the third power semiconductor element is bonded to a side of the first conductor plate, the side being farther from the second conductor plate than the first power semiconductor element is,
at least two power semiconductor elements of the second power semiconductor element and a fourth power semiconductor element are bonded to the second conductor plate, and the fourth power semiconductor element is bonded to a side of the second conductor plate, the side being farther from the first conductor plate than the second power semiconductor element is, and
in a cross-section passing through the center of the first power semiconductor element and the center of the second power semiconductor element and perpendicular to the bonding surface between the first conductor plate and the first power semiconductor element, the first power semiconductor element and the third power semiconductor element are disposed at a position at which the first length is larger than a third length from the end of the first conductor plate, the end being far from the second conductor plate, to the third power semiconductor element, and the third length is larger than the thickness of the first conductor plate.

* * * * *